United States Patent
Dubey et al.

(10) Patent No.: US 9,602,085 B2
(45) Date of Patent: Mar. 21, 2017

(54) DATA STORAGE ELEMENT AND SIGNAL PROCESSING METHOD

(71) Applicant: Synopsys, Inc., Mountain View, CA (US)

(72) Inventors: Prashant Dubey, Uttar Pradesh (IN); Shivangi Mittal, Delhi (IN); Raushan Kumar Jha, Uttar Pradesh (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/894,323

(22) PCT Filed: Nov. 7, 2013

(86) PCT No.: PCT/US2013/069016
§ 371 (c)(1),
(2) Date: Nov. 25, 2015

(87) PCT Pub. No.: WO2014/197004
PCT Pub. Date: Dec. 11, 2014

(65) Prior Publication Data
US 2016/0126936 A1 May 5, 2016

(30) Foreign Application Priority Data
Jun. 7, 2013 (EP) ..................................... 13171090

(51) Int. Cl.
*H03K 3/00* (2006.01)
*H03K 3/037* (2006.01)
(Continued)

(52) U.S. Cl.
CPC ............. *H03K 3/0375* (2013.01); *G06F 1/12* (2013.01); *H03K 3/35625* (2013.01); *H04L 7/0338* (2013.01)

(58) Field of Classification Search
CPC .................................................. H03K 3/0375
See application file for complete search history.

(56) References Cited

U.S. PATENT DOCUMENTS

| 6,924,682 B1* | 8/2005 | Smith | H03K 3/0375 326/94 |
| 2003/0223271 A1* | 12/2003 | Byeon | G11C 5/147 365/185.18 |
| 2010/0244918 A1* | 9/2010 | Moyer | G01R 31/31816 327/208 |

FOREIGN PATENT DOCUMENTS

EP     0477706 A2    4/1992

OTHER PUBLICATIONS

PCT International Search Report and Written Opinion, PCT Application No. PCT/US2013/069016, Jan. 8, 2014, 10 pages.

* cited by examiner

*Primary Examiner* — Daniel Puentes
(74) *Attorney, Agent, or Firm* — Fenwick & West LLP (57) ABSTRACT

A data storage element comprises a master stage (MS) with a first and a second latch (LI, L2), an error stage (ES) and a slave stage (SLS). The first latch (LI) generates in a clocked fashion based on a clock signal (CLK, CLKT, CLKB) a first logical signal (DOUT1) based on an input signal (DATA) in relation to a first threshold level (TP1). The second latch generates (L2) in a clocked fashion based on the clock signal (CLK, CLKT, CLKB) a second logical signal (DOUT2) based on the input signal (DATA) in relation to a second threshold level (TP2). The second threshold level (TP2) is distinct from the first threshold level (TP1). The error stage provides an error signal (ER) with a first logical state if the first and the second logical signal (DOUT1 , DOUT2) have the same logical state, and with a second logical state they have different logical states. The

(Continued)

slave stage (SLS) sets an output value (Q) of the data storage element to a common logical state of the first and the second logical signal (DOUT1, DOUT2) when the error signal (ER) has the first logical state, and keeps the output value (Q) unchanged otherwise.

25 Claims, 8 Drawing Sheets

(51) Int. Cl.
*G06F 1/12* (2006.01)
*H04L 7/033* (2006.01)
*H03K 3/3562* (2006.01)

DATA STORAGE ELEMENT AND SIGNAL PROCESSING METHOD

BACKGROUND

The disclosure relates to a data storage element for providing an output value based on an input signal, and to a signal processing method.

In various digital applications logical signals are transferred between different clock domains. For example, heterogeneous, asymmetric or asynchronous multicore processors are designed, which often use clock-domain crossing due to such asynchronous clock domains.

In conventional applications first-in-first-out, FIFO interfaces or asynchronous interfaces are used for data exchanges, which use serially coupled flip flops to avoid failure due to metastability. The number of such flip flops in such synchronizer means is inter alia dependent on clock frequency, a data rate and the used technology. For example in applications with clock frequencies over 200 MHz in 32 nm technology three cascaded flip flops are required, while for clock frequencies above 800 MHz the number of required flip flops may be at least five. Hence a special design and a greater area on an integrated circuit are needed for reducing a mean time between failures, MTBF, in such circuits.

SUMMARY

Disclosed is a configuration to provide an improved concept for processing data between different clock domains. The improved concept is based on the idea that the generation of an output signal or the respective output value of the output signal is made dependent not on one threshold level but on at least two threshold levels. To this end a first logical signal is generated based on an input signal in relation to a first threshold level, and a second logical signal is generated based on the input signal in relation to a second threshold level.

Herein, the first and the second threshold level are distinct from each other. Preferably, the generation of the first and the second logical signal is performed in a clocked fashion based on a clock signal, in particular a clock signal of the target clock domain. The first and the second logical signal are evaluated to generate an error signal. In particular, the error signal is generated with a first logical state if the first and the second logical signal have the same logical state, and with a second logical state if the first and the second logical signal have different logical states. Finally, the output value is set to a common logical state of the first and the second logical signal when the error signal has the first logical state, whereas the output value is kept unchanged otherwise.

In consequence, the state of the output value can change if a value of the input signal is higher than both the first and the second threshold level or lower than both the first and the second threshold level. Accordingly, a failure rate can be significantly reduced with the improved concept described above. In particular, the occurrence of metastable states can be avoided or at least reduced.

An embodiment of a data storage element according to the improved concept comprises a master stage with a first and a second latch, an error stage and a slave stage. The first latch is configured to provide the first logical signal based on the input signal in relation to the first threshold level, wherein the first logical signal is generated in a clocked fashion based on a clock signal. Similarly, the second latch is configured to provide the second logical signal based on the input signal in relation to the second threshold level, wherein the second logical signal is generated in a clocked fashion based on the clock signal, and wherein the second threshold level is distinct from the first threshold level. The error stage is configured to provide the error signal with the first logical state if the first and the second logical signal have the same logical state, and with the second logical state if the first and the second logical signal have different logical states. The slave stage is configured to set the output value of the data storage element to a common logical state of the first and the second logical signal when the error signal has the first logical state, and to keep the output value unchanged otherwise.

The processing of the input signal according to the improved concept is independent from a clock frequency of the clock signal, in particular works as well for lower clock frequencies as for higher clock frequencies. Therefore, compared to conventional approaches, embodiments according to the improved concept can be produced with less circuit elements resulting in lower area consumption on an integrated circuit. This further reduces costs in applications using the improved concept.

In an embodiment of the data storage element, during a first phase of the clock signal, the error stage is configured to provide the error signal with the first logical state if the first and the second logical signal have the same logical state, and with the second logical state if the first and the second logical signal have different logical states. During a second phase of the clock signal, the error stage is configured to provide the error signal with the second logical state. For example, such embodiment effects that the output value can only change in a clocked fashion depending on the clock signal.

The function of the first and the second latch can be implemented in various ways. For example, each of the first and the second latch comprises a first and a second CMOS (complementary metal oxide semiconductor) inverter, wherein respective inputs of the first and the second CMOS inverter are connected to the output of the corresponding other CMOS inverter. Furthermore, the inputs of the first CMOS inverters of the first and the second latch are coupled to a data input for receiving the input signal. For example, the first and the second logical signal are provided at the respective output of the second CMOS inverters of the first and the second latch.

In some implementation forms of the data storage element, a first inverted logical signal is provided at the output of the first CMOS inverter of the first latch and a second inverted logical signal is provided at the output of the first CMOS inverter of the second latch. Furthermore, the error stage is configured to provide the error signal with the first logical state if the first and the second logical signal have a high logical state or if the first and the second inverted logical signal have a high logical state, and with the second logical state if the first and the second logical signal have different logical states. Hence, by evaluating both the (non-inverted) logical signals and the inverted logical signals the accurateness or fidelity of the output value can be increased further.

In some implementations of the data storage element, each of the first and the second latch comprises a first transmission gate connecting the input of the respective first CMOS inverter to the data input, and a second transmission gate connecting the input of the respective second CMOS inverter to a supply potential terminal or to a ground potential terminal. The transmission gates are preferably controlled on the basis of the clock signal.

As it is well-known to the skilled person, a CMOS inverter usually comprises a PMOS transistor and an NMOS transistor connected in series and having their gates connected together as an input. A common connection of the controlled sections of the both MOS transistors forms the output of the inverter. Some kind of current source and/or current think may be connected in series to the two complementary MOS transistors.

The first and the second threshold level may be determined or set by a respective dimensioning of the latches or of the CMOS inverters within the latches. In a conventional CMOS inverter, the threshold for distinguishing between a low and a high output state is usually given as about the middle of the input voltage range. By respective dimensioning of the latch respectively the CMOS inverters, the threshold level can be set higher or lower than such conventional threshold level.

For example, the first and/or the second threshold level are determined or set by difference in the width-length ratio (W/L) between transistors of the first and the second CMOS inverters in each latch. For example, the transistors of the first inverter have a greater width-length ratio than the transistors of the second CMOS inverter, or vice versa.

A further possibility to influence the threshold level is to control the reaction time of the first CMOS inverter with respect to the second CMOS inverter. For example, for at least one of the first and the second latch (L1, L2) a controlled path of the respective first and second CMOS inverters is connected to a supply potential terminal (VDD) or to a ground potential terminal (GND) by means of a respective transistor switch. One of transistor switches is controlled on the basis of the clock signal and the other one of the transistor switches is controlled on the basis of a delayed version of the clock signal. Hence, the delay determines the respective threshold level.

In various embodiments of the data storage element the slave stage comprises a first series connection of a first switch controlled on the basis of the first logical signal and a second switch controlled on the basis of the second logical signal. The first series connection is coupled between a supply potential terminal and an intermediate terminal, wherein the switches of the first series connection are closed for a low state of the respective logical signal. The slave stage further comprises a second series connection of a first switch controlled on the basis of the first logical signal and a second switch controlled on the basis of the second logical signal, wherein the second series connection coupled between the intermediate terminal and a ground potential terminal. The switches of the second series connection are closed for a high state of the respective logical signal.

The slave stage further comprises an inverter coupled to the intermediate terminal at its input and providing the output value at its output. A third series connection of a first switch controlled by the output value and a second switch controlled by an inverted version of the error signal is coupled between the supply potential terminal and the intermediate terminal. The switches of the third series connection are closed for a low state of the respective controlling signal, namely the output value and the inverted version of the error signal. A fourth series connection of a first switch controlled by the output value and a second switch controlled by the error signal is coupled between the intermediate terminal and the ground potential terminal, wherein the switches of the fourth series connection are closed for a high state of the respective controlling signal, namely the output value and the error signal. The first and the second series connection form an inverter-like structure that only gives a specific output value, if the first and the second logical signal have the same state. Otherwise, a signal at the intermediate terminal is undetermined or floating.

The third and the fourth series connection form a further inverter-like structure which is so to say anti-parallel to the inverter coupled between the intermediate terminal and an output of the slave stage. In particular, the third and the fourth series connection form an active inverter as long as the error signal is active, i.e. the logical signals have different states. Hence, the error controlled inverter comprising the third and the fourth series connection, together with the inverter of the slave stage can generate a metastable state holding the output value. If no error is present, i.e. the error signal has a low state, the signal at the intermediate terminal is not influenced by the feedback inverter and directly sets the output value by means of the inverter.

In a particular implementation form of the slave stage described above, the first series connection further comprises a third switch controlled by the error signal, and the second series connection further comprises a third switch controlled by the inverted version of the error signal. Hence, a signal at the intermediate terminal can only have a distinct value, if the error signal has a low state, in particular if no error is present.

In the various embodiments described above, the first threshold level may be in the lower half of a given input range of the input signal, and the second threshold level may be in the upper half of the given input range. For example, the first threshold level is between 20% and 30%, preferably around 25% of the input range. Similarly, the second threshold level may be between 70% and 80%, preferably around 75% of the given input range. Hence, even with process and temperature variations, the probability of a false transmission in one of the latches is affected by the even lower probability of failure of the respective other latch, having its threshold level clearly spaced apart, such that a probability of a false transmission in the total system is negligible.

In the embodiment described above, the master stage comprises two latches with different threshold levels. In further embodiments, the master stage may further comprise a third latch having the same structure as the first and/or the second latch and providing a third logical signal based on a third threshold level that is different from both the first and the second threshold levels. The structure of the third latch is not described here for reasons of clarity, but is a parent to the skilled reader from the embodiments of the first and the second latch described above. The data storage element having three or even more latches with different threshold levels may have adapted error stages and slave stages which include the evaluation of the third logical signal or respective further logical signals. Hence, only if all threshold levels are crossed in the same direction, the output value will change its state. This further reduces the change of an unwanted metastable state and thus increases the MTBF.

An embodiment of the signal processing method according to the improved concept for providing an output value based on an input signal may have similar steps as described above for the data storage element. For example, a first logical signal is generated in a clocked fashion based on a clock signal on the bases of the input signal in relation to a first threshold level. Similarly, a second logical signal is generated in a clocked fashion based on a clock signal on the basis of the input signal in relation to a second threshold level. An error signal is provided with a first logical state if the first and the second logical signal have the same logical state, and with a second logical state if the first and the second logical signal have different logical states. The output value is set to a common logical state of the first and the second logical signal when the error signal has the first logical state, and kept unchanged otherwise.

An embodiment of a method for processing data between different clock domains according to the improved concept comprises generating an output signal that is dependent on at least two threshold levels by generating a first logical signal based on an input signal in relation to a first threshold level, and a second logical signal based on the input signal in relation to a second threshold level.

Preferably, the first and the second threshold level are distinct from each other.

For example, the generation of the first and the second logical signal is performed in a clocked fashion based on a clock signal in a target clock domain.

In some embodiments an error signal is generated with a first logical state if the first and the second logical signal have the same logical state, and with a second logical state if the first and the second logical signal have different logical states.

For example, an output value of the output signal is set to a common logical state of the first and the second logical signal when the error signal has the first logical state and the output value is kept unchanged otherwise.

Further embodiments of the signal processing method and the method for processing data between different clock domains, in particular with respect to the generation of the error signal and the selection of the threshold levels become apparent from the various embodiments of the data storage element described above.

The text below explains the configuration in detail using exemplary embodiments with reference to the drawings. Same references are used for same elements or elements having a similar function in the various figures. Hence, the description of elements in one figure is not repeated necessarily in all of the following figures.

DETAILED DESCRIPTION

Figure 1:
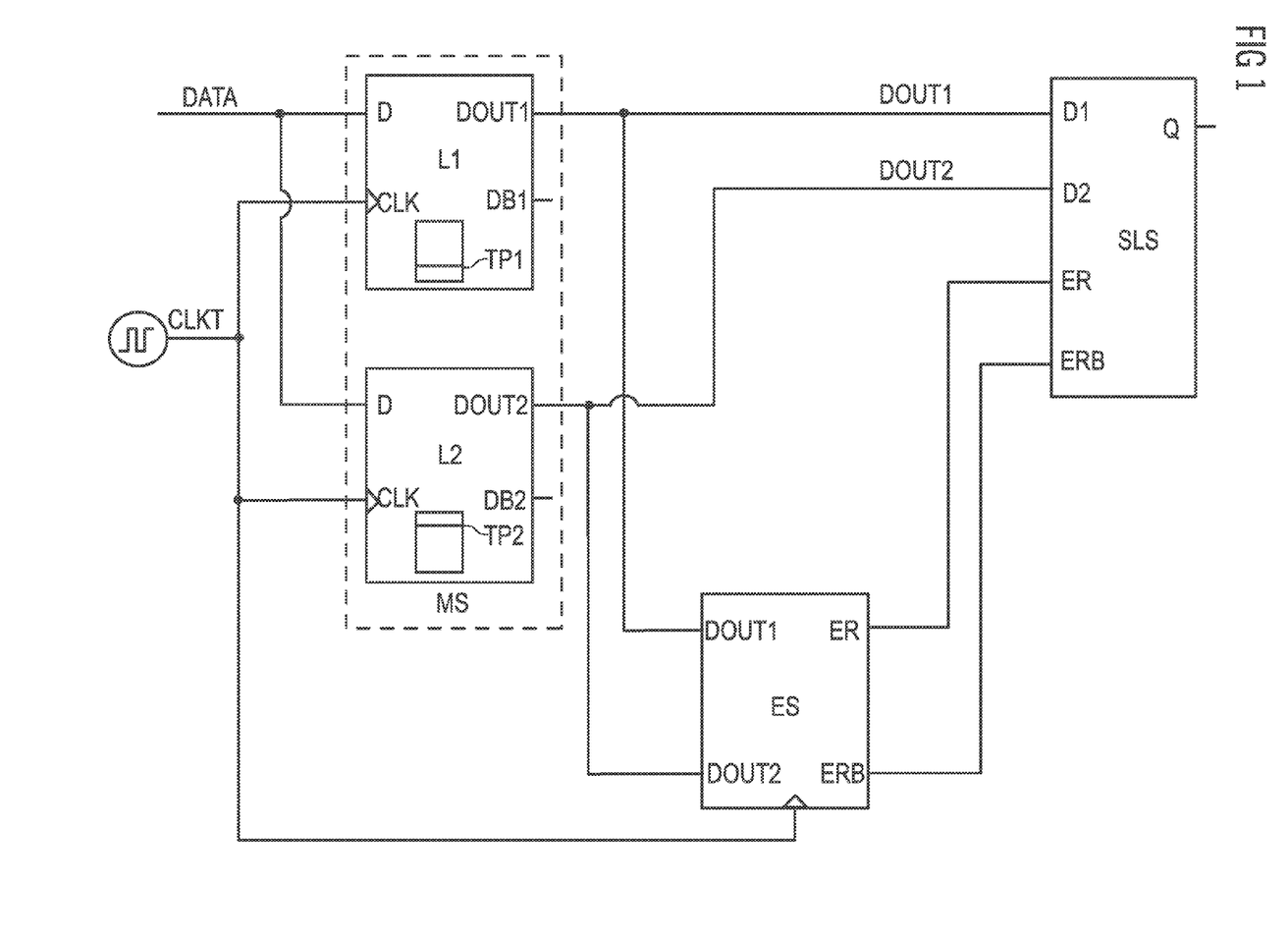
FIG. 1 shows an embodiment of a data storage element.

Referring now to Figure (FIG.) 1, it shows an exemplary embodiment of a data storage element that particularly can be used as an input/output buffer. The storage element comprises a master stage MS with a first and a second latch L1, L2, an error stage ES and a slave stage SLS. The first latch L1 and the second latch L2 each comprise data inputs D, which are commonly coupled to an input of the storage element for receiving an input signal DATA. Furthermore, the two latches L1, L2 comprise a clock input CLK for receiving a clock signal CLKT, which for example is provided by an internal or external clock generator. The first latch L1 comprises a data output for providing a first logical signal DOUT1 and an inverse data output for providing an inverted logical signal DB 1. Similarly, the second latch L2 comprises a data output for providing a second logical signal DOUT2 and an inverted data output for providing a second inverted logical signal DB2. The first and the second latch L1, L2 perform a flip-flop like latching function, wherein the first latch L1 uses a first threshold level TP1 and the second latch L2 uses a second threshold level TP2, which will be explained later in more detail.

The error stage ES has two inputs, which are connected to the data outputs of the first and the second latch L1, L2 for receiving the first logical signal DOUT1 and the second logical signal DOUT2. In some implementation forms, also the first and the second inverted logical signal DB1, DB2 may be provided to the error stage ES. At a first output the error stage ES provides an error signal ER, while an inverted error signal ERB is provided at a second output of the error stage ES. The error stage ES further has an input for receiving the clock signal CLKT.

The slave stage SLS has a first data input D1 for receiving the first logical signal DOUT, a second data input D2 for receiving the second logical signal DOUT2 and two error inputs for receiving the error signal ER and the inverted error signal ERB. An output signal or output value Q is provided as an output of the slave stage SLS. Preferably, the output providing the output value Q forms an output of the data storage element.

The first and the second latch L1, L2 operate in a clocked fashion depending on the clock signal CLKT and provide the respective logical signal DOUT1, DOUT2 depending on a signal level of the input signal DATA in relation to the respective threshold level TP1, TP2. In particular the first latch L1 is configured to provide the first logical signal DOUT1 based on the input signal DATA in relation to the first threshold level, and the second latch L2 is configured to provide the second logical signal DOUT2 based on the input signal DATA in relation to the second threshold level TP2.

As indicated in the symbolic drawings of the first and the second threshold level TP1, TP2, the two threshold levels TP1, TP2 are distinct from each other. For example, the first threshold level TP1 is a lower threshold level while the second threshold level TP2 is a higher threshold level. For example, the first threshold level TP1 is in the range of 20% to 30% of a given input range of the input signal DATA, particularly around 25%. The second threshold level TP2 may be in the range of 70% and 80% of the input range, particularly around 75%.

For example the first and the second latch L1, L2 have the function of a clocked comparator which provides the respective logical signal DOUT1, DOUT2 with a high logical state if the input signal DATA has a level being higher than the respective threshold level TP1, TP2. Accordingly, the first and the second latch L1, L2 provide the respective logical signal DOUT1, DOUT2 with a low logical state, if the level of the input signal DATA is below the respective threshold level TP1, TP2. As the threshold levels TP1, TP2 are different from each other the logical signals DOUT1, DOUT2 do not change for the same level of the input signal DATA and therefore not at the same time.

The data storage element according to the improved concept uses this behavior to change the output value Q only if both logical signals DOUT1, DOUT2 have the same logical state, i.e. if the level of the input signal DATA is higher than the upper threshold level TP2 or both are lower than the lower threshold level TP1. If the level of the input signal DATA is between the first and the second threshold level TP1, TP2, the output value Q preferably stays at its previous state, i.e. remains unchanged.

To this end the error stage ES is configured to provide the error signal ER with a first logical state if the first and the second logical signal DOUT1, DOUT2 have the same logical state, and with the second logical state if the first and the second logical signal DOUT1, DOUT2 have different logical states. In preferred embodiments, in which the error stage ES is configured to provide the error signal ER with the first logical state if the first and the second logical signal DOUT1, DOUT2 have the same logical state, and with the second logical state if the first and the second logical signal DOUT1, DOUT2 have different logical states during a first phase of the clock signal CLKT. During the second phase of the clock signal CLKT, the error stage ES is configured to provide the error signal ER with the second logical state. The inverted error signal ERB is an inverted version of the error signal ER and may be generated during the generation of the error signal ER.

The slave stage SLS is configured to set the output value Q of the data storage element to a common logical state of the first and the second logical signal DOUT1, DOUT2 when the error signal ER has the first logical state, and to keep the output value Q unchanged otherwise. To this end, the slave stage SLS performs respective logic operations with the first and the second logical signal DOUT1, DOUT2 and at least one of the error signal ER and the inverted signal ERB. The probability of a false decision to change the output value Q is minimized by the proposed improved concept, because the decision is based on the outputs of two imbalanced latches which have different trip points, i.e. different levels of change of their respective output signal DOUT1, DOUT2. As such trip points are basically dependent on process and temperature variations, the different trip points lead to a disjoined probability distribution of the individual trip points. This ensures that both the latches L1, L2 do not go into a metastable state at the same time.

The function of the latches L1, L2, the error stage ES and the slave stage SLS may be implemented in various forms, which easily become apparent to the skilled person. However, exemplary embodiments for the implementation are described in the following.

Figure 2:
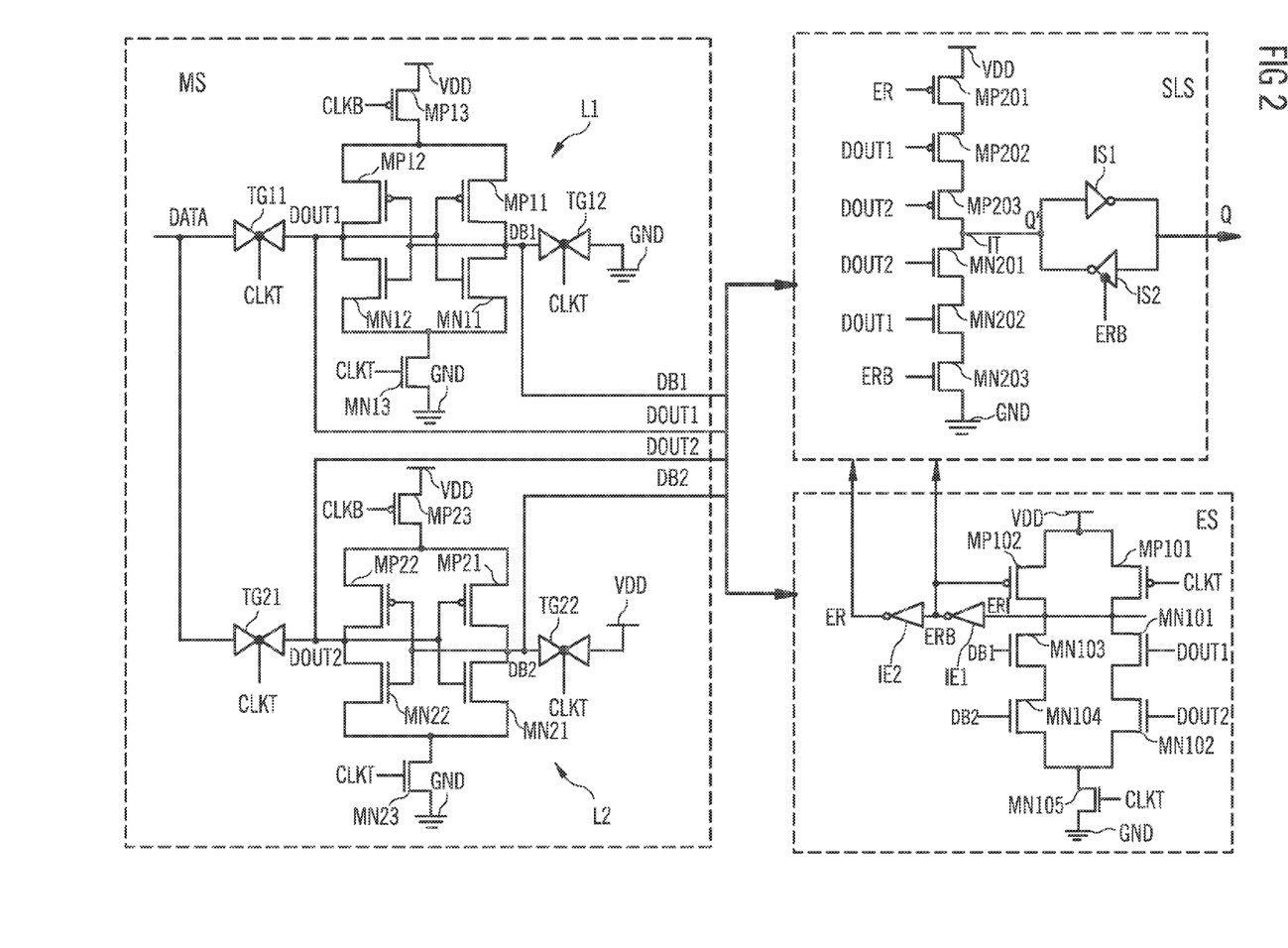
FIG. 2 shows a further embodiment of a data storage element.

FIG. 2 shows an example of an implementation of the data storage element on the basis of transistors and simple logical elements. In the embodiment of FIG. 2, each of the first and the second latch L1, L2 comprises a first and a second CMOS inverter, wherein respective inputs of the first and the second CMOS inverter are connected to the output of the corresponding other CMOS inverter. Inputs of the first CMOS inverter of the first and the second latch L1, L2 are coupled to a data input for receiving the input signal DATA. The first and the second logical signal DOUT1, DOUT2 are provided at the respective output of the second CMOS inverters of the first and the second latch L1, L2.

The first inverter of the first latch L1 comprises a series connection of a PMOS transistor MP11 and an NMOS transistor MN11, the gates of which are commonly connected and coupled to the input for receiving the input signal DATA by means of a transmission gate TG11. The transmission gate TG11 is driven by the clock signal CLKT. The second inverter of the first latch L1 comprises a series connection of a PMOS transistor MP12 and an NMOS transistor MN12 that have their gates connected together and commonly coupled to a ground potential terminal GND by means of a further transmission gate TG12, which is also driven by the clock signal CLKT. The two series connections of the first and the second inverter are coupled to a supply potential terminal VDD by means of a further PMOS transistor MP13, which is driven by a further clock signal CLKB that preferably is a complementary version of the clock signal CLKT. Furthermore, the two series connections are commonly connected to the ground potential terminal GND by means of a further NMOS transistor MN13 that is driven by the clock signal CLKT. The common gate connection of the transistors MP11, MN11 forms an input of the first inverter of the first latch L1 and is connected to the connection point of the two controlled sections of the transistors MP12, MN12 of the second inverter, which further provides the first logical signal DOUT1. Similarly, the common gate connection of the transistors MP12, MN12 of the second inverter is connected to the connection point of the controlled sections of the transistors MP11, MN11, which provides the first inverted logical signal DB1. It is noted that the transistors of the first latch L1 are dimensioned such that in an overall behavior the first threshold level TP1 results.

The second latch L2 is basically built similarly to the first latch L1. Hence, the first inverter of the second latch L2 comprises a series connection of a PMOS transistor MP21 and an NMOS transistor MN21 which have their common gate connection coupled to the input for receiving the input signal DATA by means of a further transmission gate TG21, which is driven by the clock signal CLKT. The second inverter of the second latch L2 comprises a series connection of a PMOS transistor MP22 and a NMOS transistor MN22 having the common gate connection connected to an output of the first inverter MP21, MN21 for providing the second inverted logical signal DB2, and coupled to the supply potential terminal VDD by means of a further transmission gate TG22 being driven by the clock signal CLKT. The input of the first inverter MP21, MN21 is coupled to the output of the second inverter MP22, MN22 for providing the second logical signal DOUT2. As in the first latch, the two series connections are coupled to the supply potential terminal VDD by means of a further PMOS transistor MP23 that is driven by the complementary clock signal CLKB. Furthermore, the two series connections of the inverters are commonly connected to the ground potential terminal GND by a further NMOS transistor MN23 that is driven by the clock signal CLKT. The second threshold level TP2 preferably is set by respective dimensioning of the transistors of the second latch L2. Some examples of setting the threshold levels TP1, TP2 are described later in conjunction with FIG. 6 and FIG. 7.

During operation of the data storage element, the latches L1, L2 operate in two phases depending on a state of the clock signal CLKT. If the transmission gates TG11, TG12, TG21, TG22 are in a conducting state, i.e. the clock signal CLKT has a low state, the states of the output signals DOUT1, DOUT2 have the same level as the input signal DATA. Furthermore, as the transistors MP13, MN13, MP23, MN23 are non-conducting, the respective inverters will not work. Hence, the signals DB1, DB2 correspond to the ground potential respectively the supply potential.

If the clock signals CLKT changes its state such that the transmission gates TG11, TG12, TG21, TG22 are in a non-conducting state and the transistors MP13, MN13, MP23, MN23 are conducting. Hence, the comparison function of the inverters of the latches L1, L2 starts working, with the initial values at the inverter inputs respectively outputs of the previous clock state. Hence, the first and the second logical signal DOUT1, DOUT2 as well as the inverted logical signals DB1, DB2 will assume defined logical high respectively low states due to the back-to-back configuration of the first and the second inverter in each latch.

The error stage ES comprises a first series connection of a PMOS transistor MP101, that is controlled by the clock signal CLKT, an NMOS transistor MN101, that is controlled by the first logical signal DOUT1 and a second NMOS transistor MN102, that is controlled by the second logical signal DOUT2. A second series connection comprises a PMOS transistor MP102, an NMOS transistor MN103 that is controlled by the first inverted logical signal DB1, and an NMOS transistor MN104, that is controlled by the second inverted logical signal DB2. The two series connections are connected to the supply potential terminal VDD at their upper end and are commonly connected to the ground potential terminal GND at their lower end by a further NMOS transistor MN105, which is controlled by the clock signal CLKT.

An intermediate error signal ERI is generated at a common connection between the PMOS transistors MP101, MP102 with the series connections of transistors MN101, MN102 respectively MN103, MN104. A first inverter IE1 is connected to that connection point for generating the inverted error signal ERB, and a second inverter IE2 is connected in series to the first inverter IE1 for providing the error signal ER.

If the clock signal CLKT has a low level, the intermediate error signal ERI is drawn to the supply potential such that during that clock state the error signal ER always has the high logical state. Accordingly, the inverted error signal ERB has the low logical state.

If the clock signal CLKT has a high state, the transistor MP101 is non-conducting and the transistor MN105 is conducting. The state of the intermediate error signal and, as a result, the error signals ER, ERB depend on the state of the first and the second logical signal DOUT1, DOUT2 and the first and the second inverted logical signal DB1, DB2. If either both the logical signals DOUT1, DOUT2 have a high state or both the signals DB1, DB2 have a high state, the intermediate error signal ERI is drawn to the ground potential, indicating a low logical state. If the logical signals have different states, the intermediate error signal ERI is drawn to the supply potential VDD by means of the transistor MP102 which is controlled by the inverted error signal ERB having the low state from the previous clock state.

The slave stage SLS comprises an inverter like structure with a PMOS series connection connected between the supply potential terminal VDD and an intermediate terminal IT, the PMOS series connection comprising a PMOS transistor MP201 controlled by the error signal ER, a PMOS transistor MP202 controlled by the first logical signal DOUT1, and a PMOS transistor MP203 controlled by a second logical signal DOUT2. The inverter like structure further comprises an NMOS series connection comprising an NMOS transistor MN201 controlled by the second logical signal DOUT2, an NMOS transistor MN202 controlled by the first logical signal DOUT1 and an NMOS transistor MN203 controlled by the inverted error signal ERB, the series connection being connected between the intermediate terminal IT and the ground potential terminal GND. The intermediate terminal IT is coupled to an output for providing the output value Q by a back-to-back inverter structure with a first inverter structure IS1 which at its input is coupled to the intermediate terminal IT and at its output provides the output value Q. A second inverter structure IS2 is coupled in the opposite direction in parallel to the first inverter structure IS1. However, the second inverter structure IS2 is functionally controlled by the inverted error signal ERB. In other words, the inverted function of the second inverter structure IS2 is only deactivated if the inverted error signal ERB has a high state, i.e. no error is present.

Hence, as long as an error is indicated, the first and the second inverter structure IS1, IS2 maintain a state of the output value Q due to the anti-parallel feedback. If no error is indicated and the logical signals DOUT1, DOUT2 have the same state, an inverted version Q' at the intermediate terminal IT can be determined by the input inverter structure. As at the same time the function of the inverter structure IS2 is deactivated, the newly set inverted signal Q' is inverted by the first inverter structure IS1 to generate the output value Q. This value will be set or maintained until a further common change of the logical signals DOUT1, DOUT2.

The structure of the data storage element described above is basically independent of a clock frequency of the clock signal CLKT. Hence, also for higher clock frequencies no further circuit parts or elements, in particular subsequent synchronizer flip-flops to generate a well-defined state of the output value Q are necessary.

Figure 3:
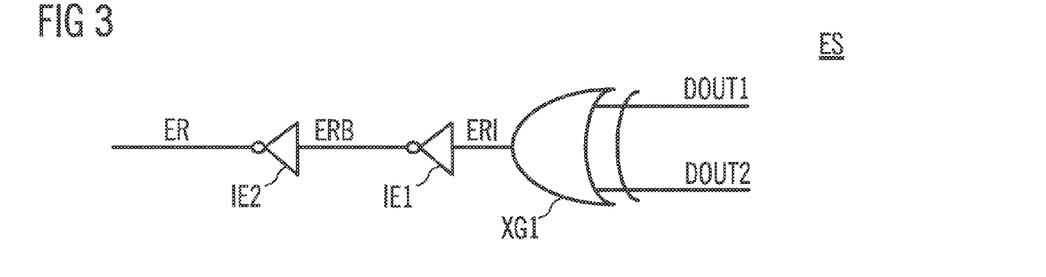
FIG. 3 shows an embodiment of an error stage.

FIG. 3 shows an alternative implementation of the error stage ES. In this embodiment, the error stage ES comprises an XOR gate XG1 which is input with the first and the second logical signal DOUT1, DOUT2. An output of the XOR gate XG1 provides the intermediate error signal ERI. Similar to the embodiment shown in FIG. 2, a first and a second inverter IE1, 1E2 are connected in series to the XOR gate XG1 for generating the inverted error signal ERB and the error signal ER, respectively.

Figure 4:
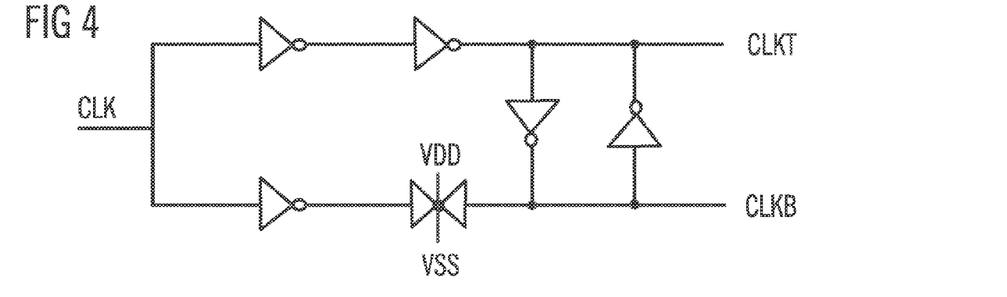
FIG. 4 shows an embodiment of a clock generation circuit.

FIG. 4 shows an example of a clock processing circuit for generating the clock signal CLKT and the complementary clock signal CLKB from an input clock signal CLK. To this end, a series connection of two inverters is provided with the clock signal CLK for generating the output clock signal CLKT. In a similar fashion, a series connection of an inverter and a transmission gate is used to generate the complementary clock signal CLKB. Two inverters are connected in an antiparallel fashion between the clock outputs for insuring that the clock signal CLKT and the complementary clock signal CLKB preferably are non-overlapping. The transmission gate in the lower circuit path is used for timing purposes as a counter part to the second inverter and the upper circuit path. Such clock processing circuit may be advantageous if, for example, voltage levels of the input clock signal CLK are different from desired voltage levels of the clock signals CLKT, CLKB. Furthermore, the clock processing circuit may act as a buffer circuit.

Figure 5:
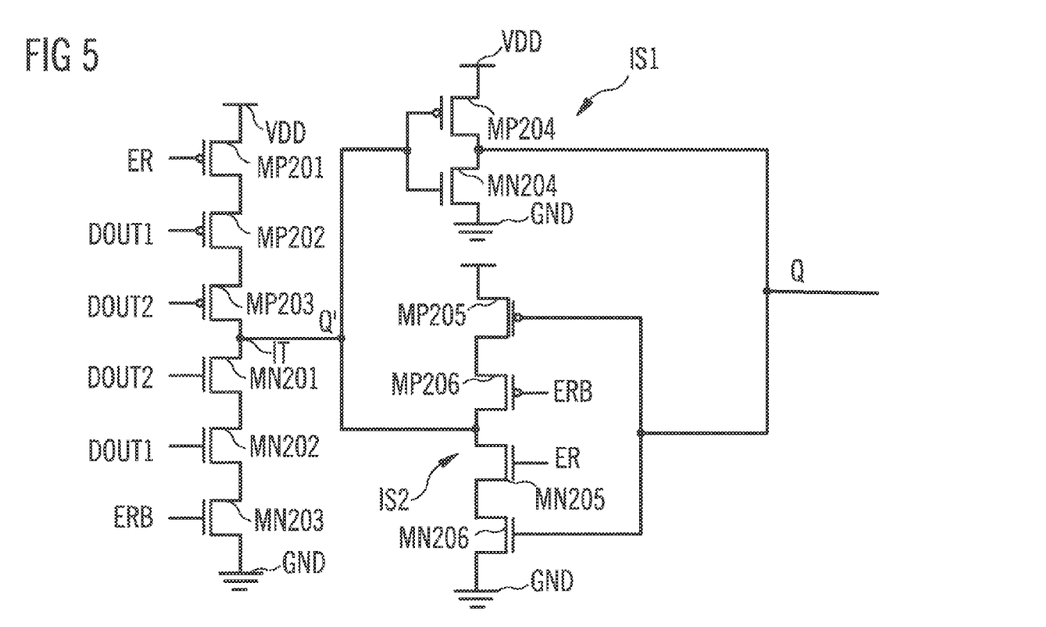
FIG. 5 shows an embodiment of a slave stage.

FIG. 5 shows an example of an implementation of the slave stage SLS that is based on the implementation of the slave stage SLS shown in FIG. 2. In particular, the first inverter structure IS1 comprises a CMOS inverter consisting of the PMOS transistor MP204 and the NMOS transistor MN204 connected between the supply potential terminal VDD and the ground potential terminal GND and having their common gate connection connected to the intermediate terminal IT. Hence, the first inverter structure IS1 basically is a conventional CMOS inverter.

The second inverter structure IS2 comprises elements of a conventional CMOS converter with a PMOS transistor MP205 and a NMOS transistor MN206 having their gate connection commonly connected to the output of the slave stage SLS, at which the output value Q is present. Furthermore, a further PMOS transistor MP206 is connected in series to the transistor MP205, and a further NMOS transistor MN205 is connected in series to the transistor MN206. The connection point of the two PMOS transistors MP205, MP206 with the two NMOS transistors MN205, MN206 is connected to the intermediate terminal.

If the error signal ER has a high state and consequently the inverted error signal ERB has a low state, the two transistors MP206 and MN205 are conducting, resulting in a classical CMOS inverter function with the transistors MP205, MN206. However, if the error signal ER is in a low state and consequently the inverted error signal ERB is in a high state, a potential at the intermediate terminal IT will not be influenced by the second inverter structure IS2 due to the non-conducting states of the transistors MN205, MP206.

As described before with the embodiment of FIG. 2, if the inverter function of the second inverter structure IS2 is deactivated, the voltage level generated by the input inverter structure at the intermediate terminal IT influences the level of the output value Q due to the always active inverter function of the first inverter structure IS1. In other words, the output value Q is only able to be changed if the second inverter structure IS2 is deactivated by a low error signal ER respectively a high inverted error signal ERB.

Figure 6:
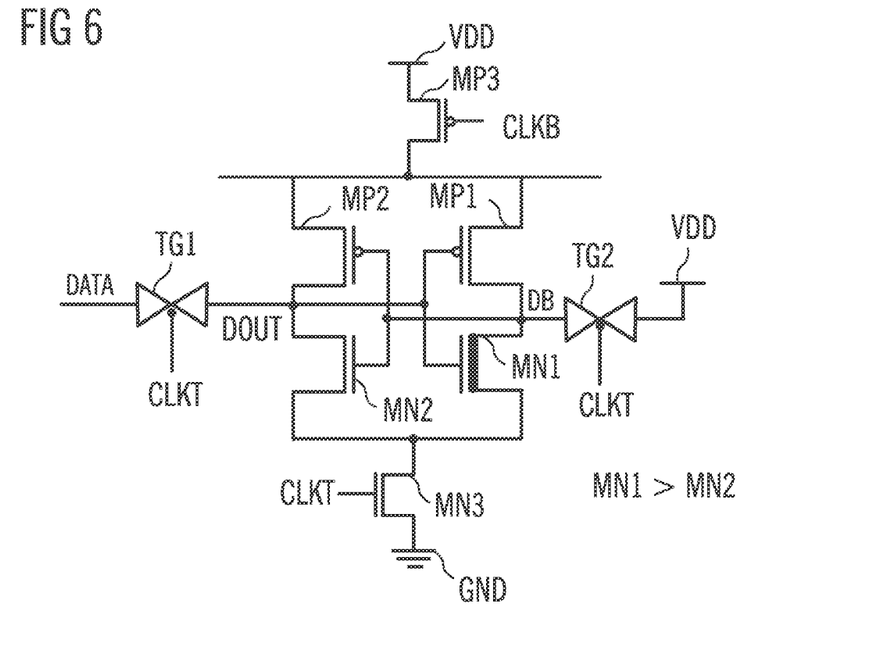
FIG. 6 shows an embodiment of a latch for usage in the master stage of a data storage element.

FIG. 6 shows an implementation form of a latch that can be used for the latches L1, L2 of the master stage. As can be easily seen, the basic structure of the embodiment of FIG. 6 corresponds to the structure shown for the first latch L1 or the second latch L2. For example, transistor MP3 corresponds to transistors MP13 and MP23, transistors MP1, MP2 correspond to transistors MP11, MP12 and MP21, MP22, transistors MN1, MN2 correspond to transistors MN11, MN12 and MN21, MN22 and transistor MN3 corresponds to transistors MN13 and MN23. Similarly, the transmission gates TG1, TG2 correspond to transmission gates TG11, TG12 and TG21, TG22.

In this embodiment, a width to length ratio W/L of the transistor MN1 of the first inverter is greater than the respective width to length ratio of the transistor MN2 of the second inverter. This is indicated by the thicker channel drawn for transistor MN1 in FIG. 6, and by MN1>MN2.

If all width to length ratios of the transistors are the same, the resulting threshold level of the latch would be at about 50% of the input range. However, with the imbalanced width to length ratio shown in FIG. 6, the threshold level of the latch is moved to the lower half of the input range. In a similar fashion, if the width to length ratio of the transistor MN2 would be greater than that of the transistor MN1, the threshold level would move to the upper half of the input range.

Figure 7:
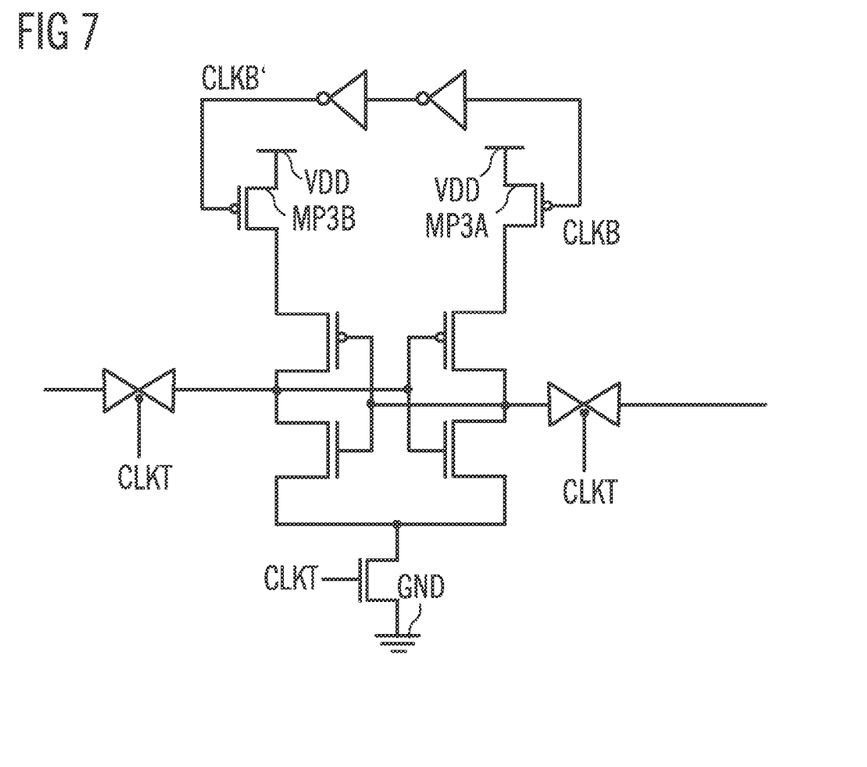
FIG. 7 shows a further embodiment of a latch that can be used in a master stage of a data storage element.

FIG. 7 shows a further example of an implementation form of a latch that can be used for one of the first and the second latch in the master stage. In this embodiment, the threshold level is set by using a specific timing control in the two inverters of a latch. Similar to the embodiments described before, also this latch comprises two inverters coupled in an anti-parallel fashion. Compared to the previous embodiments, the upper PMOS transistor MP13, MP23 respectively MP3 is divided up into a first transistor MP3a connected only to the current path of the first inverter, and a second PMOS transistor MP3b connected only to the current path of the second inverter. The first transistor MP3a is controlled by the complementary clock signal CLKB, while the second transistor MP3b is controlled by a delayed version CLKB' of the complementary clock signal CLKB. To this end, the two gates of the transistors MP3a, MP3b are coupled by two serially connected inverters effecting the delay. Assuming that, as an the previous embodiments, the output of the second inverter forms the logical signal and the output of the first inverter forms the inverted logical signal, the configuration of FIG. 7 effects a movement of the threshold level from the middle of the input range to the lower half of the input range.

If the threshold level is to be moved in the upper half of the input range, the signal direction of the inverters is to be changed such that the transistor MP3b is controlled by the complementary clock signal CLKB and the transistor MP3a is controlled by the delayed version CLKB'.

Figure 8:
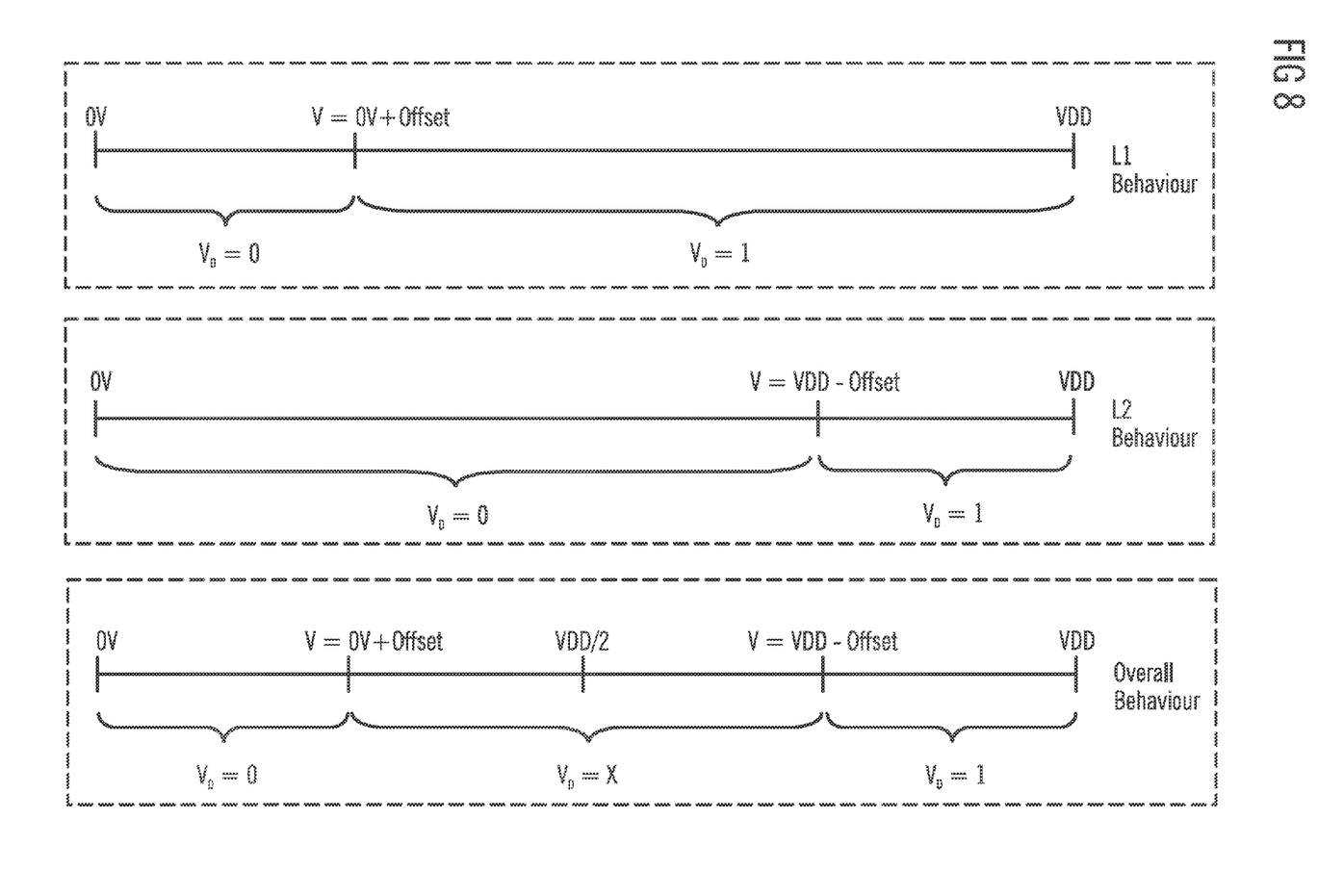
FIG. 8 shows signal diagrams with respect to input-output relationship of latches and the data storage element.

FIG. 8 shows exemplary signal diagrams for input/output behavior of the two latches L1, L2 taken alone and of the data storage element in total. In particular, the upper diagram shows the behavior of the first latch L1 wherein in the range from 0 V to an offset voltage corresponding to the threshold level TP1 effects a low logical state of the respective output logical signal DOUT1. For input values higher than the offset, the state of the logical signal DOUT1 is a high state. As can be seen from the upper diagram, the first threshold level TP1 is at about 25% of the input range defined by the supply voltage VDD. However, the first threshold level preferably is in the lower half of the input range.

In the middle diagram the behavior of the second latch L2 is shown. In a quasi complementary fashion, the second threshold level TP2 is chosen in the upper half of the input range, particularly at about 75% of the input range. Hence, for input values being below that level, the output DOUT2 has a low state. For input values being higher than the second threshold TP2, the output DOUT2 has a high state.

As can be seen from the two upper diagrams, the threshold levels are chosen to be symmetric with respect to the input range. In particular, while the lower threshold level TP1 is given by 0 V plus an offset voltage, the upper threshold level TP2 is given by the supply voltage VDD minus the offset voltage.

With respect to the description an explanations given above, the overall behavior of the data storage element shown in the lower diagram of FIG. 8 results in a defined output with a low state in the range from 0 V to the first threshold level, namely 0 V plus the offset voltage. Similarly, a defined high output state of the output value Q is given in the range from VDD minus offset to the supply voltage VDD. In the range between 0 V plus offset to VDD minus offset, the output of the overall system intentionally is kept undefined and does not result in a change of the output value, indicated by the value X for the output value.

Figure 9:
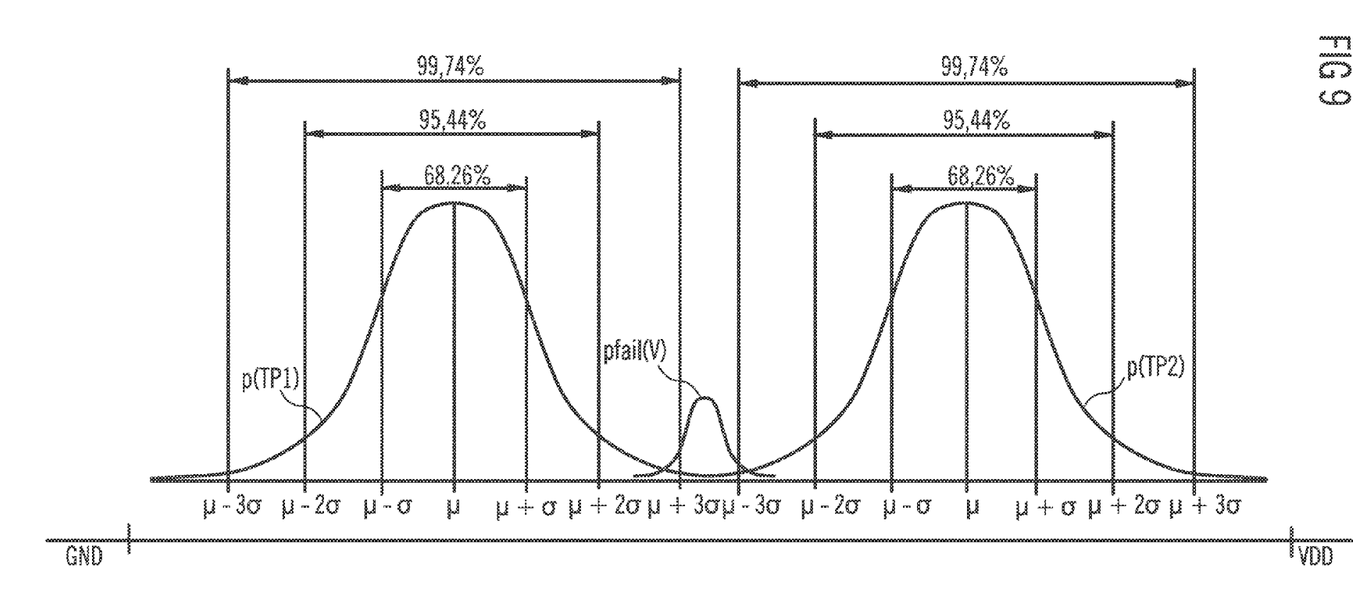
FIG. 9 shows a probability diagram of the data storage element.

FIG. 9 shows a probability diagram of output decisions for the first latch, marked by the probability p(TP1), the second latch, marked by p(TP2) and an overall failure probability pfail(V). Although the threshold levels TP1, TP2 are set at distinct levels μ in each case, due to process and temperature variations, the actual result in each latch may to have to chance to vary around the desired threshold level. This results that only in a small area between the two threshold levels a small probability is given for both latches failing to give a falls result. It should be noted that the diagram of FIG. 9 is neither to scale nor reflects an actual implementation but only gives a theoretical example of a probability distribution. In practical implementations, the probability of a false decision of the overall system is negligible, thus resulting in a near infinite meantime between failures, MTBF.

Figure 10:
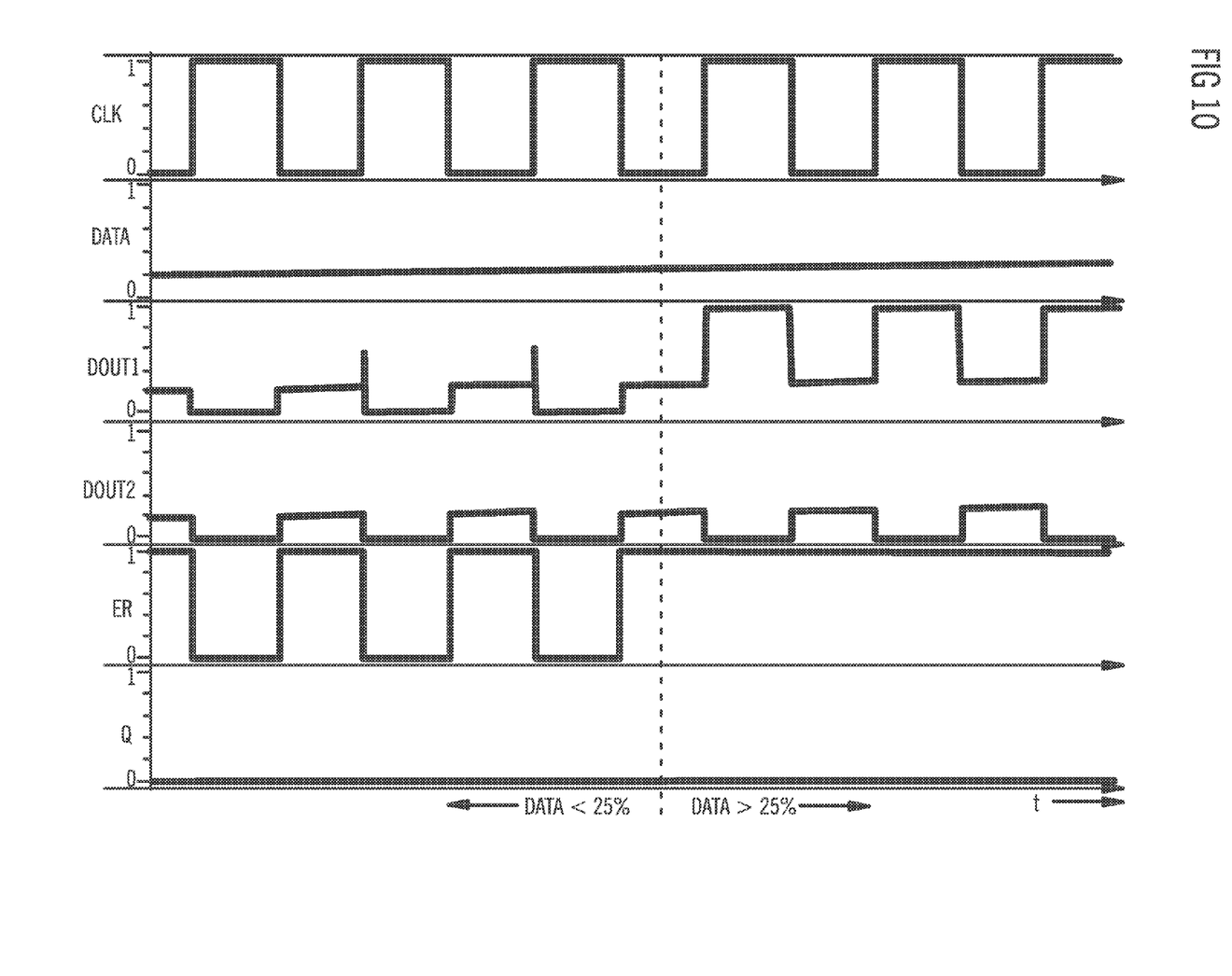
FIG. 10 shows a first signal time diagram of signals within the data storage element.
Figure 11:
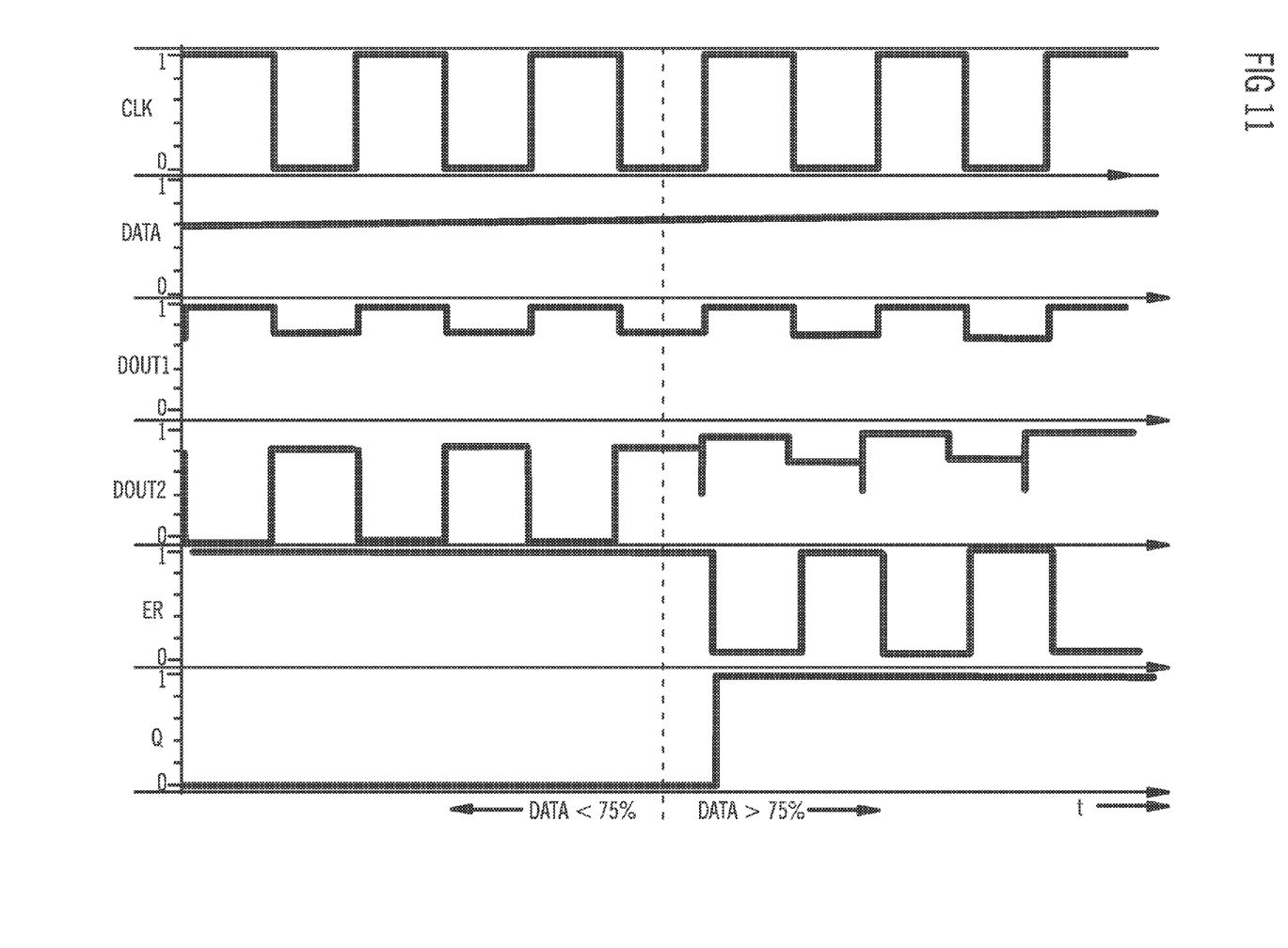
FIG. 11 shows a second signal time diagram of signals within the data storage element.

FIG. 10 and FIG. 11 show exemplary signal-time diagrams with slowly rising input signals DATA around the first threshold level TP1 of about 25% for FIG. 10 and around the second threshold level TP2 of about 75% for FIG. 11. In each of the diagrams, the first and the second logical signal DOUT1, DOUT2, the error signal ER and the output value Q are shown together with the input signal DATA and the clock signal CLK.

Referring to FIG. 10, in the left half, divided by the dashed line, the input signal DATA is below the threshold level of 25%. Hence, during the active times, the latches L1, L2 both recognize a low level and output the logical signals DOUT1, DOUT2 with a low state during the high state of the clock signal CLK. During the low state of the clock signal CLK, the signals DOUT1, DOUT2 assume the value of the input signal DATA. During the low state of the clock signal CLK, the error signal ER always has the high state. During the high state of the clock signal CLK, the error signal assumes the zero state, as both logical signals DOUT1, DOUT2 have the same, in particular the same low state for the input signal being smaller than the threshold value of the first latch L1 (and therefore also the second latch L2). With the rising input signal, the level of the input signal exceeds the threshold level of the first latch, resulting in a high state of the first logical signal DOUT1 and the high phases of the clock signal CLK. The second latch L2, having the higher threshold level, still outputs the second logical signal DOUT2 with a low state. As a consequence, the two logical states of the logical signals DOUT1, DOUT2 are different resulting in a high state of the error signal and the right half of the diagram of FIG. 10. Whereas in the left half of the diagram, the output value Q has the zero value, this value is not changed in the right half, despite the crossing of the first threshold level.

Referring now to FIG. 11, the input signal DATA is at about 75% of the input range, but lower than the threshold level in the left half, marked by the dashed line and higher than the threshold level in the right half. Accordingly, in each case for the high state of the clock signal, the first logical signal DOUT1 assumes the high state. In a second latch L2, the second logical signal DOUT2 assumes the low state for the high clock state of the clock signal CLK in a left half of the diagram. As the states of the logical signals DOUT1, DOUT2 differ, the error signal ER has the high state. Consequently, the output value Q remains at the zero state. After exceeding the second threshold level TP2 at about 75%, the second latch L2 provides the second logical signal DOUT2 with the high state during the high clock phases of the clock signal CLK. As a consequence, the error signal ER assumes the zero state during the high clock states from this moment on. As a further consequence, the output value Q changes its state from the zero value to the high logical state and remains there for the rest of the diagram.

It should be noted that in the diagrams of FIG. 10 and FIG. 11 the behavior of the overall system is shown on the basis of a slow changing input signal DATA for reasons of a better overview only. Furthermore, only the rising version of an input signal DATA is shown. However, a similar diagram would result for a falling input signal DATA, which is easily apparent for the skilled person from the above explanations.

The various embodiments described above may be combined in various combinations. Furthermore, it is also possible that further latches, for example a third or a fourth latch are included in the master stage, and respective evaluation of output logical signals is provided in the error stage and the slave stage. In such embodiments, an even finer segmentation of threshold levels may be employed.

It should be noted that MOS transistors are used in the embodiments described above only as an example. Other types of transistors may also be used. In particular, the transistors in the embodiments described above are merely defined by their function and not their technology.

REFERENCE LIST

MS master stage
L1, L2 latch
ES error stage
SLS slave stage
DATA input signal
CLK, CLKT, CLKB clock signal
DOUT1, DOUT2 logical signal
DB1, DB2 inverted logical signal
TP1, TP2 threshold level
ER, ERB error signal
Q output value
MN1 to MN206 NMOS transistor
MP1 to MP206 PMOS transistor
IS1, IS2 inverter structure
IE1, 1E2 inverter
VDD supply potential terminal
GND ground potential terminal
IT intermediate terminal
TG1 to TG22 transmission gate

What is claimed is:

1. A data storage element, comprising:
    a master stage with a first latch configured to provide a first logical signal based on an input signal in relation to a first threshold level, the first logical signal generated based on a clock signal, and with a second latch configured to provide a second logical signal based on the input signal in relation to a second threshold level, the second logical signal generated based on the clock signal, the second threshold level distinct from the first threshold level;
    an error stage configured to provide an error signal with a first logical state if the first and the second logical signal have the same logical state, and with a second logical state if the first and the second logical signal have different logical states; and
    a slave stage comprising:
    a first input line to receive the first logical signal,
    a second input line to receive the second logical signal,
    a third input line to receive the error signal, and
    an output line to output an output signal, the output signal comprising an output value of the data storage element, the output value configured to be a common logical state of the first and the second logical signal when the error signal has the first logical state, and to keep the output value unchanged otherwise.

2. The data storage element according to claim 1, wherein during a first phase of the clock signal, the error stage is configured to provide the error signal with the first logical state if the first and the second logical signal have the same logical state, and with the second logical state if the first and the second logical signal have different logical states, and during a second phase of the clock signal, the error stage is configured to provide the error signal with the second logical state.

3. The data storage element according to claim 1, wherein each of the first and the second latch comprises a first and a second CMOS inverter, wherein respective inputs of the first and the second CMOS inverter are connected to the output of the corresponding other CMOS inverter, and wherein the inputs of the first CMOS inverters of the first and the second latch are coupled to a data input for receiving the input signal.

4. The data storage element according to claim 3, wherein the first and the second logical signal are provided at the respective output of the second CMOS inverters of the first and the second latch.

5. The data storage element according to claim 3, wherein a first inverted logical signal is provided at the output of the first CMOS inverter of the first latch and a second inverted logical signal is provided at the output of the first CMOS inverter of the second latch, and wherein the error stage is configured to provide the error signal with the first logical state if the first and the second logical signal have a high logical state or if the first and the second inverted logical signal have a high logical state, and with the second logical state if the first and the second logical signal have different logical states.

6. The data storage element according to claim 3, wherein each of the first and the second latch comprises a first transmission gate connecting the input of the respective first CMOS inverter to the data input, and a second transmission gate connecting the input of the respective second CMOS inverter to a supply potential terminal or to a ground potential terminal, wherein the transmission gates are controlled on the basis of the clock signal.

7. The data storage element according to claim 3, wherein the first and/or the second threshold level are determined by a difference in the length-width ratio between transistors of the first and the second CMOS inverters in each latch.

8. The data storage element according to claim 3, wherein for at least one of the first and the second latch a controlled path of the respective first and second CMOS inverters is connected to a supply potential terminal or to a ground potential terminal by means of a respective transistor switch, wherein one of the transistor switches is controlled on the basis of the clock signal and the other one of the transistor switches is controlled on the basis of a delayed version of the clock signal, wherein the delay determines the respective threshold level.

9. The data storage element according to claim 1, wherein the slave stage comprises:
a first series connection of a first switch controlled on the basis of the first logical signal and a second switch controlled on the basis of the second logical signal, the first series connection coupled between a supply potential terminal and an intermediate terminal, wherein the switches of the first series connection are closed for a low state of the respective logical signal;
a second series connection of a first switch controlled on the basis of the first logical signal and a second switch controlled on the basis of the second logical signal, the second series connection coupled between the intermediate terminal and a ground potential terminal, wherein the switches of the second series connection are closed for a high state of the respective logical signal;
an inverter coupled to the intermediate terminal at its input and providing the output value at its output;
a third series connection of a first switch controlled by the output value and a second switch controlled by an inverted version of the error signal, the third series connection coupled between the supply potential terminal and the intermediate terminal, wherein the switches of the third series connection are closed for a low state of the respective controlling signal; and
a fourth series connection of a first switch controlled by the output value and a second switch controlled by the error signal, the fourth series connection coupled between the intermediate terminal and the ground potential terminal, wherein the switches of the fourth series connection are closed for a high state of the respective controlling signal.

10. The data storage element according to claim 9, wherein the first series connection further comprises a third switch controlled by the error signal, and the second series connection further comprises a third switch controlled by the inverted version of the error signal.

11. The data storage element according to claim 1, wherein the first threshold level is in the lower half of a given input range of the input signal, and the second threshold level is in the upper half of the given input range.

12. The data storage element according to claim 1, wherein the master stage further comprises a third latch having the same structure as the first and/or the second latch and providing a third logical signal based on a third threshold level that is different from both the first and the second threshold levels.

13. A signal processing method for providing an output value based on an input signal, the method comprising:
generating, based on a clock signal, a first logical signal based on the input signal in relation to a first threshold level;
generating, based on the clock signal, a second logical signal based on the input signal in relation to a second threshold level, wherein the second threshold level is distinct from the first threshold level;
providing an error signal with a first logical state if the first and the second logical signal have the same logical state, and with a second logical state if the first and the second logical signal have different logical states; and
setting, responsive to the first logical signal, the second logical signal, and the error signal, the output value to a common logical state of the first and the second logical signal when the error signal has the first logical state, and keeping the output value unchanged otherwise.

14. The method according to claim 13, wherein
during a first phase of the clock signal, the error signal is provided with the first logical state if the first and the second logical signal have the same logical state, and with the second logical state if the first and the second logical signal have different logical states; and
during a second phase of the clock signal, the error signal is provided with the second logical state.

15. The method according to claim 13, wherein the first threshold level is in the lower half of a given input range of the input signal, and the second threshold level is in the upper half of the given input range.

16. A data storage element, comprising:
a master stage with a first latch configured to provide a first logical signal based on an input signal in relation to a first threshold level, the first logical signal generated based on a clock signal, and with a second latch configured to provide a second logical signal based on the input signal in relation to a second threshold level, the second logical signal generated based on the clock signal, the second threshold level distinct from the first threshold level, wherein the first and the second latch further comprises:
a first and a second CMOS inverter, respective inputs of the first and the second CMOS inverter are connected to the output of the corresponding other CMOS inverter, the inputs of the first CMOS inverters of the first and the second latch are coupled to a data input for receiving the input signal, wherein each of the first and the second latch comprises a first transmission gate connecting the input of the respective first CMOS inverter to the data input, and a second transmission gate connecting the input of the respective second CMOS inverter to a supply potential terminal or to a ground potential terminal, wherein the transmission gates are controlled on the basis of the clock signal;

an error stage configured to provide an error signal with a first logical state if the first and the second logical signal have the same logical state, and with a second logical state if the first and the second logical signal have different logical states; and a slave stage configured to set an output value of the data storage element to a common logical state of the first and the second logical signal when the error signal has the first logical state, and to keep the output value unchanged otherwise.

17. A data storage element, comprising:

a master stage with a first latch configured to provide a first logical signal based on an input signal in relation to a first threshold level, the first logical signal generated based on a clock signal, and with a second latch configured to provide a second logical signal based on the input signal in relation to a second threshold level, the second logical signal generated based on the clock signal, the second threshold level distinct from the first threshold level, wherein the first and the second latch further comprises:

a first and a second CMOS inverter, respective inputs of the first and the second CMOS inverter are connected to the output of the corresponding other CMOS inverter, the inputs of the first CMOS inverters of the first and the second latch are coupled to a data input for receiving the input signal, wherein for at least one of the first and the second latch a controlled path of the respective first and second CMOS inverters is connected to a supply potential terminal or to a ground potential terminal by means of a respective transistor switch, and wherein one of the transistor switches is controlled on the basis of the clock signal and the other one of the transistor switches is controlled on the basis of a delayed version of the clock signal, wherein the delay determines the respective threshold level;

an error stage configured to provide an error signal with a first logical state if the first and the second logical signal have the same logical state, and with a second logical state if the first and the second logical signal have different logical states; and a slave stage configured to set an output value of the data storage element to a common logical state of the first and the second logical signal when the error signal has the first logical state, and to keep the output value unchanged otherwise.

18. A data storage element, comprising:

a master stage with a first latch configured to provide a first logical signal based on an input signal in relation to a first threshold level, the first logical signal generated based on a clock signal, and with a second latch configured to provide a second logical signal based on the input signal in relation to a second threshold level, the second logical signal generated based on the clock signal, the second threshold level distinct from the first threshold level, an error stage configured to provide an error signal with a first logical state if the first and the second logical signal have the same logical state, and with a second logical state if the first and the second logical signal have different logical states; and a slave stage configured to set an output value of the data storage element to a common logical state of the first and the second logical signal when the error signal has the first logical state, and to keep the output value unchanged otherwise, wherein the slave stage further comprises:

a first series connection of a first switch controlled on the basis of the first logical signal and a second switch controlled on the basis of the second logical signal, the first series connection coupled between a supply potential terminal and an intermediate terminal, wherein the switches of the first series connection are closed for a low state of the respective logical signal;

a second series connection of a first switch controlled on the basis of the first logical signal and a second switch controlled on the basis of the second logical signal, the second series connection coupled between the intermediate terminal and a ground potential terminal, wherein the switches of the second series connection are closed for a high state of the respective logical signal;

an inverter coupled to the intermediate terminal at its input and providing the output value at its output;

a third series connection of a first switch controlled by the output value and a second switch controlled by an inverted version of the error signal, the third series connection coupled between the supply potential terminal and the intermediate terminal, wherein the switches of the third series connection are closed for a low state of the respective controlling signal; and a fourth series connection of a first switch controlled by the output value and a second switch controlled by the error signal, the fourth series connection coupled between the intermediate terminal and the ground potential terminal, wherein the switches of the fourth series connection are closed for a high state of the respective controlling signal.

19. The method according to claim 18, wherein the first series connection further comprises a third switch controlled by the error signal, and the second series connection further comprises a third switch controlled by the inverted version of the error signal.

20. A method for processing data between different clock domains, the method comprising:

generating, responsive to receiving a first logical signal and a second logical signal, an output signal that is dependent on at least two threshold levels by generating the first logical signal based on an input signal in relation to a first threshold level, and the second logical signal based on the input signal in relation to a second threshold level, wherein the first threshold level is in the lower half of an input range of the input signal, and the second threshold level is in the upper half of the input range, and wherein the generation of the first and the second logical signal is performed based on a clock signal in a target clock domain.

21. A method for processing data between different clock domains, the method comprising:

generating, responsive to receiving a first logical signal and a second logical signal, an output signal that is dependent on at least two threshold levels by generating the first logical signal based on an input signal in relation to a first threshold level, and the second logical signal based on the input signal in relation to a second threshold level, wherein the first threshold level is in the lower half of an input range of the input signal, and the second threshold level is in the upper half of the input range; and generating an error signal with a first logical state if the first and the second logical signal have the same logical state, and with a second logical state if the first and the second logical signal have different logical states.

22. The method according to claim 20, wherein the first and the second threshold level are distinct from each other.

23. The method according to claim 21, wherein the first and the second threshold level are distinct from each other.

24. The method according to claim 21, wherein an output value of the output signal is set to a common logical state of the first and the second logical signal when the error signal has the first logical state and the output value is kept unchanged otherwise.

25. The method according to claim 21, wherein
- the generation of the first and the second logical signal is performed based on a clock signal in a target clock domain;
- during a first phase of the clock signal, the error signal is provided with the first logical state if the first and the second logical signal have the same logical state, and with the second logical state if the first and the second logical signal have different logical states; and
- during a second phase of the clock signal, the error signal is provided with the second logical state.

* * * * *